United States Patent
Zelsacher et al.

(10) Patent No.: US 9,406,572 B2
(45) Date of Patent: Aug. 2, 2016

(54) METHOD FOR PROCESSING A SUBSTRATE AND A METHOD OF PROCESS SCREENING FOR INTEGRATED CIRCUITS

(71) Applicant: Infineon Technologies AG, Neubiberg (DE)

(72) Inventors: Rudolf Zelsacher, Klagenfurt (AT); Peter Irsigler, Obernberg am Inn (AT); Erich Griebl, Dorfen (DE); Manfred Pirker, Klagenfurt (AT); Andreas Moser, Maria-Rain (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/527,811

(22) Filed: Oct. 30, 2014

(65) Prior Publication Data

US 2016/0126149 A1 May 5, 2016

(51) Int. Cl.
*H01L 21/66* (2006.01)
*H01L 21/28* (2006.01)
*H01L 29/66* (2006.01)
*H01L 21/768* (2006.01)
*H01L 21/02* (2006.01)

(52) U.S. Cl.
CPC .......... *H01L 22/14* (2013.01); *H01L 21/02107* (2013.01); *H01L 21/28158* (2013.01); *H01L 21/768* (2013.01); *H01L 29/66568* (2013.01)

(58) Field of Classification Search
None
See application file for complete search history.

(56) References Cited

U.S. PATENT DOCUMENTS

| | | | |
|---|---|---|---|
| 6,521,469 B1 | 2/2003 | La Rosa et al. | |
| 2005/0035754 A1* | 2/2005 | Ho | G01R 31/2896 324/756.05 |
| 2005/0167718 A1* | 8/2005 | Ema | H01L 21/76801 257/301 |
| 2007/0059851 A1 | 3/2007 | Zhao et al. | |
| 2007/0134910 A1* | 6/2007 | Kariya | H01L 21/4867 438/622 |
| 2010/0246152 A1* | 9/2010 | Lin | G06F 1/16 361/783 |
| 2012/0261274 A1* | 10/2012 | Rearick | G01N 27/4145 205/789 |

OTHER PUBLICATIONS

W.W. Abadeer, "Reliability Monitoring and Screening Issues With Ultrathin Gate Dielectric Devices", IEEE Transactions on Device and Materials Reliability, vol. 1, No. 1, Mar. 2001, pp. 60-68.

* cited by examiner

*Primary Examiner* — Bilkis Jahan
(74) *Attorney, Agent, or Firm* — Viering, Jentschura & Partner mbB

(57) ABSTRACT

According to various embodiments, a method for processing a substrate may include: forming a dielectric layer over the substrate, the dielectric layer may include a plurality of test regions; forming an electrically conductive layer over the dielectric layer to contact the dielectric layer in the plurality of test regions; simultaneously electrically examining the dielectric layer in the plurality of test regions, wherein portions of the electrically conductive layer contacting the dielectric layer in the plurality of test regions are electrically conductively connected with each other by an electrically conductive material; and separating the electrically conductive layer into portions of the electrically conductive layer contacting the dielectric layer in the plurality of test regions from each other.

19 Claims, 8 Drawing Sheets

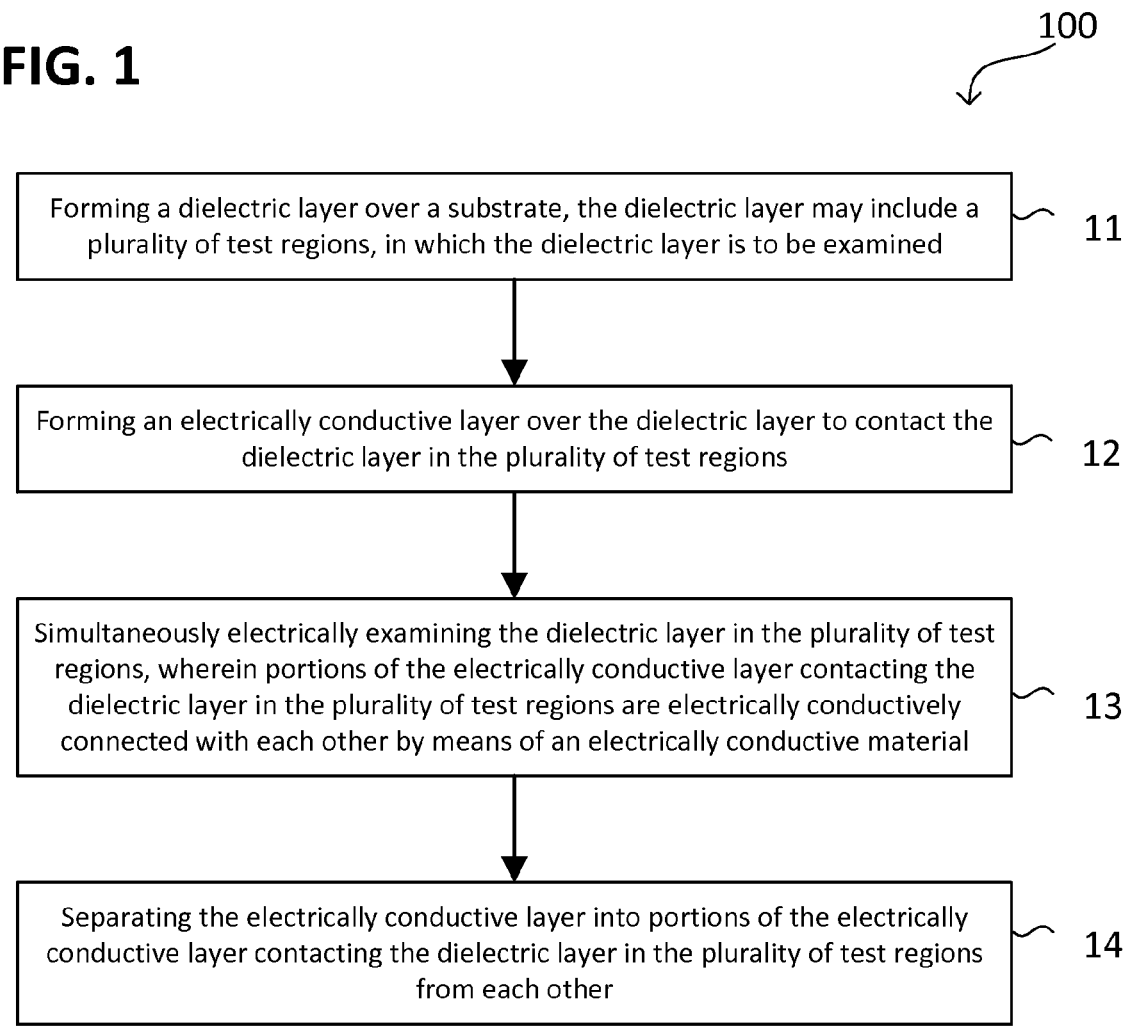

METHOD FOR PROCESSING A SUBSTRATE AND A METHOD OF PROCESS SCREENING FOR INTEGRATED CIRCUITS

TECHNICAL FIELD

Various embodiments relate generally to a method for processing a substrate and a method of process screening for integrated circuits.

BACKGROUND

In general, a semiconductor chip (also called integrated circuit, IC, chip, or microchip) may be processed in semiconductor technology on and/or in a substrate (or a wafer or a carrier). The substrate usually includes a plurality of semiconductor chips, which are processed in corresponding regions of the wafer. A completely processed semiconductor chip includes several electrical circuit components interconnected with each other to perform computing or storage operations. For fabricating such electrical circuit components, specific dielectric layers are implemented into the semiconductor chip, which later, during operation of the completely processed semiconductor chip, have to withstand high electrical fields. These dielectric layers have to fulfill high quality standards, as their reliability in withstanding electrical fields may influence the functionality of the electrical components operated in the completely processed semiconductor. A deficient dielectric layer may cause a dielectric breakdown in an electrical component resulting in potential malfunction of the corresponding semiconductor chip.

To detect semiconductor chips with a deficient dielectric layer or to evaluate the reliability of electrical circuit components, testing procedures are applied to the semiconductor chips at various stages during processing in semiconductor technology. However, conventional testing procedures are limited in their applicability (dependent on the particular semiconductor technology utilized) leading to undetected deficiencies in semiconductor chips or in electrical devices fabricated therefrom. The improvement of conventional testing procedures may be limited, requires complex steps and/or requires complex testing equipment and therefore is time and cost consuming.

SUMMARY

According to various embodiments, a method for processing a substrate may include: forming a dielectric layer over the substrate, the dielectric layer may include a plurality of test regions; forming an electrically conductive layer over the dielectric layer to contact the dielectric layer in the plurality of test regions; simultaneously electrically examining the dielectric layer in the plurality of test regions, wherein portions of the electrically conductive layer contacting the dielectric layer in the plurality of test regions are electrically conductively connected with each other by an electrically conductive material; and separating the electrically conductive layer into portions of the electrically conductive layer contacting the dielectric layer in the plurality of test regions from each other.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic flow diagram of a method for processing a substrate according to various embodiments;

DESCRIPTION

Figure 2A:
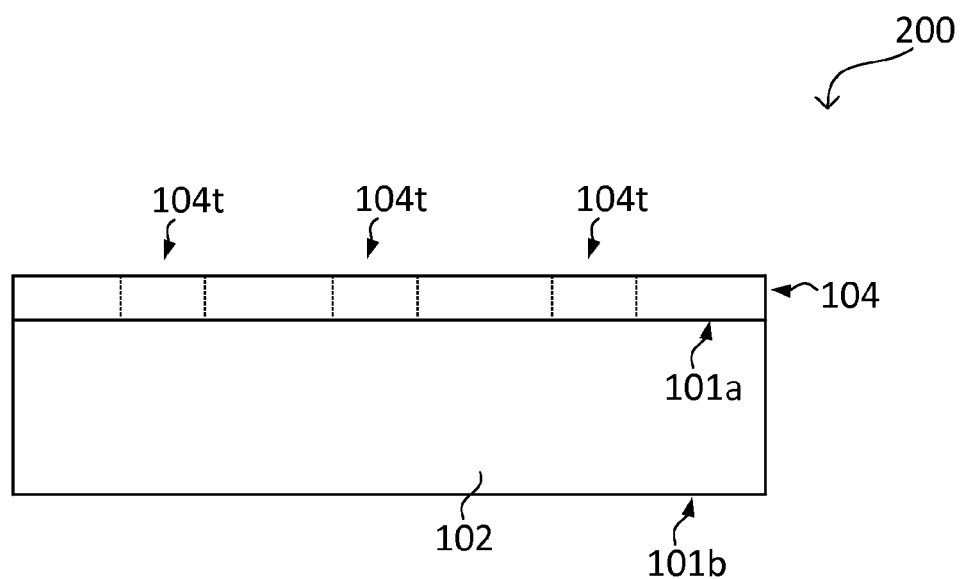
FIG. 2A to FIG. 2D respectively show a substrate at various stages during processing according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, e.g. a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The term "forming" with regards to a layer, a material, or a region, may refer to disposing, arranging, or depositing the layer, the material, or the region. A method for forming may include various deposition methods, such among others may be: chemical vapor deposition (CVD), physical vapor deposition (e.g. for dielectric materials), electrodeposition (also called electroplating, e.g. for metals or metal alloys) or spin coating (e.g. for fluid materials). Generally, a vapor deposition may be performed by sputtering, laser ablation, cathodic arc vaporization, or thermal evaporation. A method for forming metals may include metal plating, e.g. electroplating or chemical plating. The term "forming" with regards to a layer, a material, or a region may also may refer to a chemical reaction or a fabrication of a chemical composition, where e.g. at least a portion of the layer, the material, or the region is formed by a transformation of one set of chemical substances into the chemical composition. "Forming" may for example include changing the positions of electrons by breaking or forming chemical bonds between atoms of the set of chemical substances. "Forming" may further include oxidation and reduction, complexation, precipitation, an acid-base reaction, a solid-state reaction, substitution or doping, addition and elimination, diffusion or a photochemical reaction. "Forming" may for example include the application of a chemical reagent to a mother compound to change the chemical and physical properties of the mother compound; such among others may be an electrical conductivity, a phase composition or optical properties, etc.

According to various embodiments, a method for electrical examination (for electrical characterization) of a dielectric layer is provided. The method, as described herein, may be performed prior completion of an electrical circuit component (or the corresponding chip) which includes the dielectric layer. Further, a detected deficient electrical circuit component may be discarded prior to its assembly to save the corresponding production costs. Similarly, a complete wafer with a plurality of electrical circuit components may be discarded prior its completion, e.g. if a large fraction of the electrical circuit components fail the electrical examination (or corresponding criterions). The method may provide a low cost, reliable, fast, and economical procedure for electrical examination of several tens, hundreds, thousands, or even millions of electrical circuit components simultaneously prior to their completion, without the need of complex testing equipment.

According to various embodiments, during semiconductor device fabrication a plurality of integrated circuit structures (also called semiconductor chip, IC, chip, or microchip) may be processed on and/or in a substrate (or a wafer or a carrier) in corresponding regions of the substrate (so called active chip areas or active chip regions) utilizing various semiconductor processing technologies. An integrated circuit structure may include a plurality electrical circuit components, such among others may be transistors, resistors and capacitors, which are interconnected with each other and configured to perform computing or storage operations in the completely processed integrated circuit structure. In further semiconductor device fabrication the plurality of integrated circuit structures may be singulated from the substrate after the semiconductor processing by wafer-dicing to provide a plurality of singulated dies or singulated chips (so called semiconductor chips) from the plurality of integrated circuit structures of the substrate. Further, a final stage of semiconductor device fabrication may include packaging (also called assembly, encapsulation, or seal) of singulated chips, wherein a singulated chip may be encased, e.g. into a supporting material (molding material or encapsulation material) to prevent physical damage and/or corrosion of the chip. The supporting material that encases the die or the chip (so called package or mold) may also support the electrical contacts to connect the die or the chip to a peripheral device, e.g. to a circuit board.

According to various embodiments, during semiconductor processing (or semiconductor device fabrication), various material types may be processed to form an integrated circuit structure with a plurality of electrical circuit components and interconnections, such among other may be electrically insulating materials, electrically semiconducting materials (also referred as semiconductor material) or electrically conducting materials.

According to various embodiments, a substrate (e.g. a wafer or another suitable carrier) may be made of semiconductor materials of various types, including a group IV semiconductor (e.g. silicon or germanium), a group III-V semiconductor (e.g. gallium arsenide), or other semiconductor types, including group III semiconductors, group V semiconductors or polymers, for example. In various embodiments, the substrate is made of silicon (doped or undoped), in alternative embodiments, the substrate is a silicon on insulator (SOI) wafer. As an alternative, any other suitable semiconductor material can be used for the substrate, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, an electrical conducting material may include a metal, a metal alloy, an intermetallic compound, a silicide (e.g. titanium silicide, molybdenum silicide, tantalum silicide or tungsten silicide), a conductive polymer, a polycrystalline semiconductor, or a highly doped semiconductor, e.g. polycrystalline silicon (also called polysilicon) or a highly doped silicon. An electrical conducting material may be understood as material with moderate electrical conductivity, e.g. with an electrical conductivity (measured at room temperature and constant electric field direction) larger than about 10 S/m, e.g. larger than about $10^2$ S/m, or with high electrical conductivity, e.g. larger than about $10^4$ S/m, e.g. larger than about $10^6$ S/m. For example, a metal may include tungsten, aluminum, copper, nickel, magnesium, chromium, iron, zinc, tin, gold, silver, iridium, platinum, or titanium. According to various embodiments, a metal alloy or an intermetallic compound may include one metal or more than one metal, for example, various compositions of gold with aluminum, copper with aluminum, compositions of brass, or bronze.

According to various embodiments, an electrically insulating material, e.g. a dielectric material, may be understood as material with poor electrical conductivity, e.g. with an electrical conductivity (measured at room temperature and constant electric field direction) smaller than about $10^{-2}$ S/m, e.g. smaller than about $10^{-5}$ S/m, e.g. smaller than about $10^{-7}$ S/m. For example, an electrically insulating material may include a polymer, a resin, an adhesive, or a resist.

According to various embodiments, a dielectric material, e.g. a high-κ dielectric or a low-κ dielectric may include a semiconductor oxide, a metal oxide, a ceramic, a semiconductor nitride, a metal nitride, a semiconductor carbide, a metal carbide, a glass, e.g. fluorosilicate glass (FSG), a dielectric polymer, e.g. benzocyclobutene (BCB) or polyimide (PI), a silicate, e.g. hafnium silicate or zirconium silicate, a transition metal oxide, e.g. hafnium dioxide or zirconium dioxide, an oxynitride, e.g. silicon oxynitride, or any other dielectric material types. A dielectric material may withstand an electric field without breaking down (in other words without experiencing failure of its insulating properties, e.g. without substantially changing its electrical conductivity). The maximum electric field a dielectric material may withstand is described by the dielectric strength of the dielectric material. In various embodiments, a dielectric material may have a dielectric strength (measured at room temperature and constant electric field direction) greater than about 0.1 MV/cm, e.g. greater than about 1 MV/cm, e.g. greater than about 10 MV/cm, e.g. greater than about 15 MV/cm, e.g. greater than about 20 MV/cm, e.g. greater than about 50 MV/cm, e.g. greater than about 100 MV/cm.

According to various embodiments, forming electrical circuit components of an integrated circuit structure may include forming various types of a transistors, such as among others may be a field-effect transistor (FET), a junction field-effect transistor, a metal-oxide-semiconductor field-effect transistor (MOSFET), a dual-gate MOSFET, a fast-reverse or fast-recovery epitaxial diode FET, a heterostructure insulated gate FET, a modulation-doped FET, a tunnel FET, an insulated-gate bipolar transistor (IGBT), a high-electron-mobility transistor (HEMT), an ion-sensitive FET, a biologically sensitive FET, a metal-semiconductor FET, a nanoparticle organic memory FET, a graphene nanoribbon FET, a vertical-slit FET, a carbon nanotube FET, an organic FET, a DNA FET or a quantum FET. In dependency of the specific semiconductor technology in which an electrical circuit component is fabricated, various dielectric materials are processed for forming the corresponding dielectric layers. For example, an electrical circuit component (e.g. a FET) may be processed in complementary metal-oxide-semiconductor (CMOS) technology and/or in double-diffused metal-oxide-semiconductor (DMOS) technology.

According to various embodiments, forming a FET (herein also referred as transistor or transistor structure) may include forming a gate dielectric (also referred as gate dielectric region) from a dielectric material over the substrate and forming a gate electrode from of a conducting material over the gate dielectric. The gate dielectric separates the gate terminal of a FET from an underlying source terminal and an underlying drain terminal as well as an underlying conductive channel that connects source and drain when the transistor is switched on (e.g. when the transistor is operated). To operate the FET the gate electrode (also called gate metal or gate conductor) may be electrically coupled to a voltage, resulting in an electric field in the gate dielectric and the formation of the conductive channel below the gate dielectric. The gate dielectric may define a dielectric strength of the FET, which may influence the maximum electric field, which is applicable in the FET in order to modulate the electrical conductance of the conductive channel region. The dielectric strength of the gate dielectric may therefore influence the functionality of the FET. Illustratively, the gate dielectric serves as a dielectric barrier so that the FET can sustain an electric field strength in the range of greater than about 1 MV/cm or greater than about 5 MV/cm.

In analogy, according to various embodiments, other types of electrical circuit components with dielectric layers may be formed, e.g. a capacitor with a capacitor dielectric, a thyristor with a gate dielectric or other dielectrics for isolation purposes (e.g. interlayer dielectrics) as well. According to various embodiments, an integrated circuit structure may be a minor complex integrated circuit with about several tens or several hundreds of electrical circuit components or a highly complex integrated circuit with up to several millions or several billions of electrical circuit components.

In general, the density of imperfections in gate dielectrics (imperfection density) is minimized in semiconductor process technology due to continuously improving the process performance regarding cleaning before the configuration of the gate dielectric and trying to avoid contamination of the gate dielectric. Since this improvement is limited, the minimization of the imperfection density may stagnate, wherein further reduction of the imperfection density below $0.1/cm^2$ remains challenging. Furthermore, the occurrence of unspecific anomalies in the process performance may be unpredictable, since they may substantially remain uncontrollable but lead to deficient systems (e.g. integrated circuits or electric devices with deficient dielectric material).

Conventionally, a portion of the deficient (or previously damaged) systems is filtered out by stress tests, e.g. by stressing at elevated temperatures (also called Burn-In stress tests), or/and (e.g. in combination with) electrical or optical evaluating the gate dielectrics. For example, the quality (e.g. the dielectric strength) of the gate dielectric in discrete MOS transistors on a substrate is tested in a final stage of semiconductor processing in order to identify deficiencies in the gate dielectrics. Undetected deficient systems may fail during operation, e.g. in a car, due to dielectric breakdown effects in one or more than one gate dielectric, especially in bipolar-CMOS-DMOS (BCD) technology and also in discrete metal-oxide-semiconductor (MOS) transistor technology (e.g. a MOS power transistor technology). One particular reason therefore may be seen in the limited or fragmentary electrical examination of the gate dielectrics, which is provided by conventional testing procedures. For example, conventional testing procedures for examining gate dielectrics, e.g. optical methods or electrical methods, may be unsuitable to provide a complete examination of gate dielectrics, e.g. in BCD technology. For example, the gate dielectrics are electrically characterized, e.g. by measuring the gate to source leakage current, with the drain connected to the source, also called drain-source-source leakage current test (IGSS).

An imperfection density of about $0.1/cm^2$ may correspond to about 30 deficiencies (due to failures) in an 8" (inch) wafer, for example. Exemplarily, for discrete MOS transistors, fabricated in vertical transistor technology (the regarded area of gate dielectric may correspond to the total wafer area) a certain number of failures may occur per wafer up to a testing voltage of about 10 V (IGSS10). By increasing the testing voltage up to a testing voltage of about 30 V (IGSS30) further failures may occur on the wafer. The identified (or detected) deficiencies (or integrated circuits with defects) may be noted, marked (also called inked) or scraped, e.g. to be designated for discarding them.

Since examining the gate dielectric may be difficult in CMOS technology, e.g. conventional testing procedures may operate and test the gate dielectric at moderate operating voltages, there is a danger that defect chips remain undetected and may be implemented in electrical devices or may be delivered and implemented in electrical boards (e.g. printed circuit boards). For example, due to logical interconnections (the circuit layout) in the chip, some gate dielectrics may be interconnected serially and others may be interconnected in parallel. Therefore, the respective circuit layout of the chip may influence the voltage (or electric field), which each gate dielectric in the chip receives. Deficient gate dielectric, which receive less voltage will not necessarily fail in their insulating properties and therefore remain undetected.

Furthermore, conventional testing procedures are difficult (or even impossible) to apply to various semiconductor processing technologies. For example, gate dielectrics covered by polycrystalline silicon may electrically be coupled to the source (or its electric potential) which may result in gate dielectrics, which specifically are not electrically characterizable, e.g. when the wafer is already finished for further assembly. In this case, it is complicated to examine the complete gate dielectric in a transistor by measuring the corresponding IGSS. Further, conventional procedures based on optical testing methods may not be able to access the corresponding regions of interest to be tested, for example a trench oxide. In case of such complicated situations (e.g. regarding electrical examination), specific testing structures may be fabricated and examined, which may be of limited information about the gate oxide quality.

Further, since deficiencies in a gate dielectric or other processed dielectric materials may even arise from local atomic impurities in minor concentrations, it may remain uncertain, whether an improvement of conventional testing procedures (e.g. optical testing procedures) can be reached, wherein certain gate dielectrics (e.g. trench oxides) may remain challenging in their examination. Therefore, semiconductor processing with high quality standards may benefit from a highly reliable and a highly applicable examination method, as it is described herein.

A method according to various embodiments may provide a procedure to electrically examine every integrated circuit structure (e.g. of a chip) for detecting and discarding deficient chips. In other words, a method according to various embodiments provides a procedure to evaluate the quality of dielectric layers, e.g. gate dielectrics (e.g. GOX), by searching and detecting defects in the dielectric layers which are conventionally complicated to test, e.g. after they have been electrically connected with each other, e.g. in BCD technology or other technologies, as described herein.

According to various embodiments, the electrical circuit components may be formed in or at corresponding regions of a dielectric layer (also referred as test regions). Illustratively, a test region may be understood as a portion of the dielectric layer, which becomes part of an electrical circuit component (after electrical examination) in further semiconductor processing (which is e.g. split into various circuit components, e.g. transistors) or a region, which may be of particular interest for other reasons. For example, an integrated circuit structure (or chip) may include thousands of transistors, each processed in or at a test region, which may be electrically examined partially together or altogether. Already a single deficient test region in the thousands of transistors may be registered by a testing system and the corresponding integrated circuit (the corresponding chip) may be registered in a database for later marking (also called inking), e.g. for removing the chip from further assembly.

A method, as described herein, may provide detecting and eliminating chips with imperfections (also called failure points or deficiencies) in such test regions, e.g. gate dielectrics (e.g. gate oxides, also called GOX) or capacitor dielectrics. For example, a system (e.g. an integrated circuit structure or a chip) may be electrically examined in a plurality of corresponding test regions. Furthermore, the dielectric layer may be electrically examined in test regions having a thickness in a certain thickness region. For example, selecting (or grouping) certain test regions in which the dielectric layer is to be electrically examined simultaneously may be made due to various criterions, e.g. a characteristic variable, e.g. their thickness, their purpose in further semiconductor processing, a previous optical examination, or a previous electrical examination. For example, a plurality of test regions of the dielectric layer may be processed, as described herein, to electrically examine the plurality of test regions simultaneously in a first electrical examination, wherein a fraction of the plurality of test regions of the dielectric layer may be processed after the first electrical examination, as described herein, to electrically examine the fraction of the plurality of test regions simultaneously in a second electrical examination. Systems, which fail an electrical examination as described herein, e.g. due to insufficient dielectric quality (e.g. due to insufficient dielectric strength), may be discarded to avoid shipping of systems with deficiencies (also referred as deficient systems). To detect imperfections in such test regions, e.g. to detect imperfections prior to completion of the electrical circuit components, the dielectric layer may be electrically examined in the corresponding test regions. Imperfections, which result from various reasons, such as unsufficient thickness of the dielectric layer in one or more test regions (e.g. in a gate dielectric), particles (e.g. micro particles or nano particles) in one or more test regions, crystallographic defects in one or more test regions and contamination in one or more test regions, may be detected by the method as described herein. For example, imperfections which result from at least one of the reasons may be detected by the method, as described herein. For simultaneously electrically examining a plurality of test regions (e.g. particular GOX regions, e.g. particular transistors), they may be electrically contacted by a conducting layer, e.g. by a polycrystalline silicon layer. After examining the plurality of test regions, the polycrystalline layer may be patterned and etched to form gates for transistors.

Further, according to various embodiments, weak or deficient systems or substrates (e.g. wafer) or a batch of substrates (also called lots) may be removed from further processing, e.g. from pattering transistors therefrom, bonding, interconnecting, housing or packaging. The substrates removed from further processing may reduce the production costs, as the costs for completing the removed products are omitted (e.g. not assembled). Further, a comprehensive analysis of production processes, e.g. furnace processes, may be possible, which enables a fast reaction according to results of the electrical examination concerning the gate dielectric quality. Further, a subsumption of gate dielectrics with similar thickness or similar electrical properties may be performed, e.g. based on the report.

FIG. 1 shows a schematic flow diagram of a method 100 of processing a substrate (in other words a carrier, e.g. a wafer) according to various embodiments, wherein the method 100 may include, in 11, forming a dielectric layer over the substrate. The dielectric layer may include a plurality of test regions. The test regions may be regions, in which the dielectric layer is to be examined. The method may further include, in 12, forming an electrically conductive layer over the dielectric layer to contact the dielectric layer in the plurality of test regions, and, in 13, simultaneously electrically examining the dielectric layer in the plurality of test regions, wherein portions of the electrically conductive layer contacting the dielectric layer in the plurality of test regions are electrically conductively connected with each other by (means of) an electrically conductive material. The method may further include, in 14, separating the electrically conductive layer into portions of the electrically conductive layer contacting the dielectric layer in the plurality of test regions from each other (to provide a plurality of portions of the electrically conductive layer contacting the dielectric layer in the plurality of test regions). The method 100 may be further configured, as described herein.

According to various embodiments, forming an electrically conductive layer over the dielectric layer to contact the dielectric layer in the plurality of test regions may further include partially removing the conductive layer to separate the plurality test regions which are contacted. In other words, the conductive layer may be patterned or structured (in a first process) by partially removing the conductive layer to isolate the plurality test regions, which are contacted (or which are designated to be examined) from the rest of the wafer. To prepare separated gate terminals the patterning (from the first process) may be refined by further partially removing the conductive layer (in a second process), e.g. after electrically examining the dielectric layer in the plurality of test regions.

Illustratively, a test region of the plurality of test regions may be designated to form a gate dielectric or a transistor dielectric therefrom. By electrically examining the plurality of test regions a value of a characteristic variable of the plurality of test regions may be measured (or quantified). The characteristic variable (e.g. an electrical variable) of the plurality of test regions among others may be: a dielectric strength of the plurality of test regions, a current (e.g. a current density or a leakage current) flowing through the plurality of test regions, a resistance of the plurality of test regions, a permittivity (e.g. a relative permittivity, also called dielectric constant, or an absolute permittivity) of the plurality of test regions, a capacitance of the plurality of test regions, an I-V-characteristic of the plurality of test regions, a frequency or phase (e.g. a phase difference, also called phase shift) of an electrical signal applied to the plurality of test regions, an electrical conductivity of the plurality of test regions, a voltage dropping over the plurality of test regions or an electrical power consumed by the plurality of test regions. The characteristic electrical variable of the plurality of test regions may be temperature dependent, time dependent or frequency dependent (e.g. dependent on the frequency of an applied electrical voltage or an applied electrical current).

According to various embodiments, electrically examining may include coupling an electrical signal (e.g. a time dependent electrical signal, e.g. an alternating electrical signal or a continuous electrical signal) to the plurality of test regions and measuring the characteristic electrical variable of the plurality of test regions based on the electrical signal. In other words, the characteristic electrical variable of the plurality of tests regions corresponds to the electrical signal. The electrical signal may be an electrical current, an electrical voltage, or an electrical power. For example, an electrical voltage may be coupled to the plurality of test regions and a corresponding electrical current flowing through the plurality of test regions may be measured. In analogy, also an electrical current may be coupled to the plurality of test regions and a corresponding electrical voltage may be measured. For example, the electrical current and the electrical voltage may be phase shifted or define an electrical power.

According to various embodiments, a quality of the plurality of test regions may be evaluated based on the value of a characteristic variable. For example, the quality of the plurality of test regions may be sufficient if the value of a characteristic variable is e.g. in a predetermined range of values or e.g. greater than a predetermined value. The predetermined range of values may be defined by the specific requirements for fabricating reliable electrical circuit components or a reliable integrated circuit structure from the plurality of test regions examined. In other words, a reliability of the plurality of test regions may be categorized based on the characteristic variable.

FIG. 2A to FIG. 2D respectively show a substrate 200 (in other words a carrier 200, e.g. a wafer 200) in a cross-sectional view (e.g. along plane 111, see FIG. 5A or FIG. 5B) at various stages during processing according to various embodiments, e.g. during method 100 is carried out.

As illustrated in FIG. 2A, the substrate 200 may include a semiconductor material 102 (e.g. a part of a wafer or a semiconductor carrier) with a first side 101a (or a first surface 101a) and a second side 101b (or second surface 101b) opposite the first side 101a (or first surface 101a). According to various embodiments, the first surface 101a may be a main processing surface of the substrate 200, e.g. for forming electrical circuit components. The substrate 200 may have a thickness (e.g. perpendicular to the first side 101a and/or to the second side 101b) in the range from about 100 µm to about 5 mm, e.g. in the range from about 100 µm to about 1 mm, e.g. in the range from about 300 µm to about 800 µm. The substrate 200 may be a thin substrate 200 or an ultrathin substrate 200 with a thickness less than about 100 µm, e.g. in the range from about 5 µm to about 100 µm, e.g. with a thickness less than 50 µm. According to various embodiments, the substrate 200 may be made of the semiconductor material 102, as described herein, also referred as substrate material 102.

According to various embodiments, a dielectric layer 104 may be formed on the first side 101a (also called top side 101a) of the substrate 200. The dielectric layer 104 may be formed from a dielectric material, as described herein. For example, the dielectric material may be solid and electrically insulating. For example, the dielectric layer 104 may be formed by depositing the dielectric material on the substrate 200. Alternatively, the dielectric layer 104 may be formed by depositing other materials on the substrate 200 and transforming them into a dielectric material, e.g. by a chemical reaction, e.g. by oxidation, e.g. by thermal oxidation or wet oxidation. For example, the dielectric layer 104 may be formed from the semiconducting material 102 of the substrate 200 to form a semiconducting oxide layer 104 on the substrate. For example, a dielectric layer 104 may be formed in gate oxide region 104t the by oxidizing silicon of the substrate 200 to form a layer of silicon dioxide (e.g. with a thickness in the range of about 5 nm to about 200 nm).

According to various embodiments, the dielectric layer 104 may include a plurality of test regions 104t, for example, several tens, several hundreds, several thousands or more than several thousands, e.g. several millions of test regions 104t. Illustratively, the plurality of test regions 104t may be portions of the dielectric layer 104, in which the dielectric layer is to be examined. For example, the plurality of test regions 104t may be portions of the dielectric layer 104 from which gate dielectrics may be fabricated, e.g. for the fabrication of several transistors over the first surface 101a.

According to various embodiments, the plurality of test regions 104t may be part of a substantially closed dielectric layer 104. For example, a dielectric material disposed between the test regions of the plurality of test regions 104t may be the same as the dielectric material in the plurality of test regions 104t. Alternatively, a dielectric material disposed between the test regions of the plurality of test regions 104t may be different from the dielectric material in the plurality of test regions 104t. In analogy, other types of materials may be disposed between the test regions of the plurality of test regions 104t. In an alternative embodiment, the plurality of test regions 104t may be separated from each other, in other words part of a partly closed dielectric layer 104.

Figure 2B:
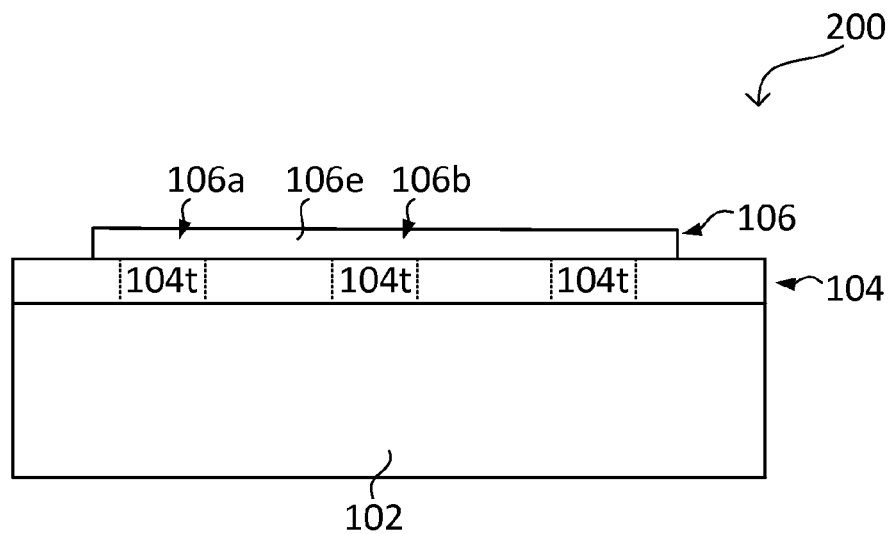

As illustrated in FIG. 2B, an electrically conductive layer 106 may be formed on the dielectric layer 104. The electrically conductive layer 106 may be formed from an electrically conductive material 106e, as described herein; the electrically conductive material 106e may be solid and electrically conducting. The electrically conductive layer 106 may be formed such, that the electrically conductive material 106e is electrically contacting every test region of the plurality of test regions 104t.

The electrically conductive layer 106 may cover a portion of the dielectric layer 104, illustratively at least a portion of the dielectric layer 104 with the plurality of test regions 104t. Alternatively, the electrically conductive layer 106 may cover at least substantially or complete dielectric layer 104 (e.g. of a chip) to electrically contact all test regions 104t of the dielectric layer 104 (e.g. all test regions 104t of the chip).

The electrically conductive layer 106 may be formed such that portions 106a, 106b of the electrically conductive layer 106 contacting the dielectric layer 104 in the plurality of test regions 104t are electrically conductively connected with each other. In other words, the plurality of test regions 104t may be connected in parallel with each other by the electrically conductive layer 106 (or the electrically conductive material 106e).

Figure 2C:
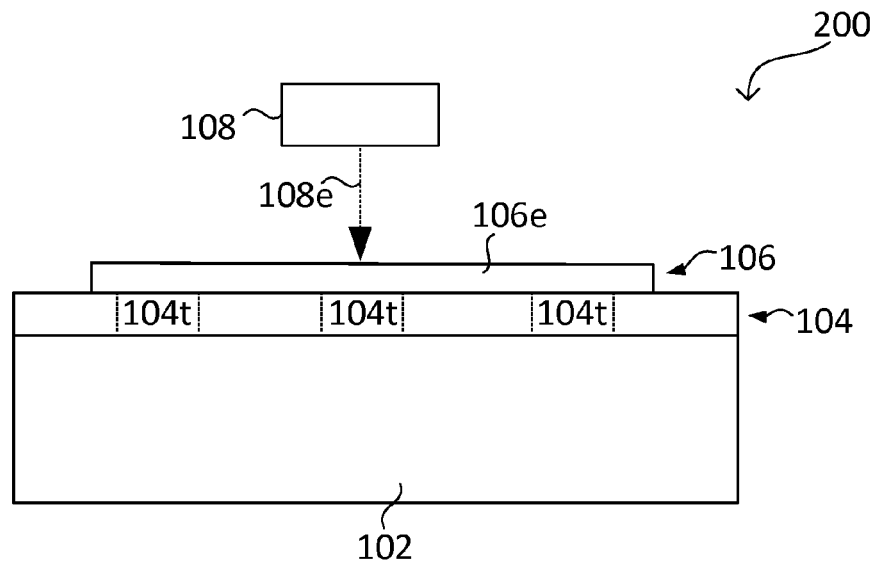

As illustrated in FIG. 2C, the dielectric layer 104 may be electrically examined 108e in the plurality of test regions 104t. A measurement device 108, e.g. a measurement circuit 108, may be coupled to the electrically conductive layer 106 to electrically examine 108e the dielectric layer 104 in the plurality of test regions 104t. The measurement device 108 (also called test device 108) may be configured to electrically characterize the dielectric layer 104 in the plurality of test regions 104t, e.g. to measure 108e the characteristic variable of the dielectric layer 104 in the plurality of test regions 104t, e.g. to measure a dielectric strength of the dielectric layer 104 in the plurality of test regions 104t.

Figure 2D:
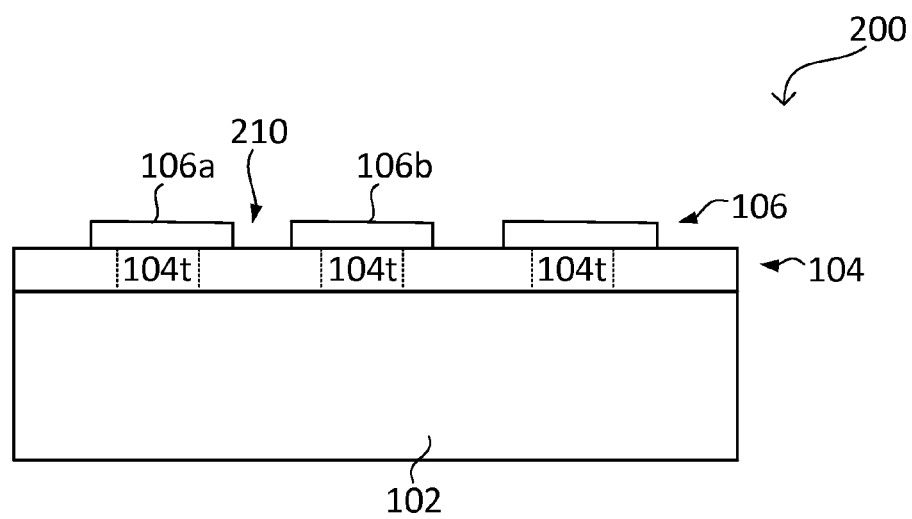

As illustrated in FIG. 2D, the portions 106a, 106b of the electrically conductive layer 106 contacting the dielectric layer 104 in the plurality of test regions 104t may be separated from each other. Therefore, a trench structure 210 may be formed, e.g. by etching (e.g. wet etching, plasma etching or reactive etching, e.g. reactive ion etching), sawing or milling, through at least the electrically conductive layer 106 to electrically separate at least a first portion 106a of the electrically conductive layer 106 from a second portion 106b of the electrically conductive layer 106. The first portion 106a of the electrically conductive layer 106 may contact a first test region of the plurality of test regions 104t and the second portion 106b of the electrically conductive layer 106 may contact a second test region of the plurality of test regions 104t.

According to various embodiments, at least the first portion 106a of the electrically conductive layer 106 (or in analogy the second portion 106b of the electrically conductive layer 106) may be designated for forming a gate electrode 106a for a transistor therefrom. The gate electrode 106a (also called gate terminal or gate metal, if made from a metal) may be electrically insulated from the substrate material 102 by a test region of the plurality of test regions 104t (the test region of the plurality of test regions 104t underlying the gate electrode 106a). In other words, the first portion 106a of the electrically conductive layer 106, the substrate material 102 underlying the first portion 106a of the electrically conductive layer 106, and the test region of the plurality of test regions 104t between them may be processed further to form a transistor structure therefrom.

Alternatively, at least the first portion 106a of the electrically conductive layer 106 (or in analogy the second portion 106b of the electrically conductive layer 106) may be designated for forming an electrode 106a of a capacitor (also called capacitor terminal 106a) therefrom. The capacitor terminal 106a may be electrically insulated from the substrate material 102 by a test region of the plurality of test regions 104t (the test region of the plurality of test regions 104t underlying the capacitor terminal 106a). In other words, the first portion 106a of the electrically conductive layer 106, the substrate material 102 underlying the first portion 106a of the electrically conductive layer 106, and the test region of the plurality of test regions 104t between them may be processed further to form a capacitor therefrom.

FIG. 3A to FIG. 3G respectively show a substrate 200 (in other words a carrier 100, e.g. a wafer 100) in a cross-sectional view (e.g. along plane 111, see FIG. 5A or FIG. 5B) at various stages during processing according to various embodiments, e.g. during method 100 is carried out.

Figure 3A:
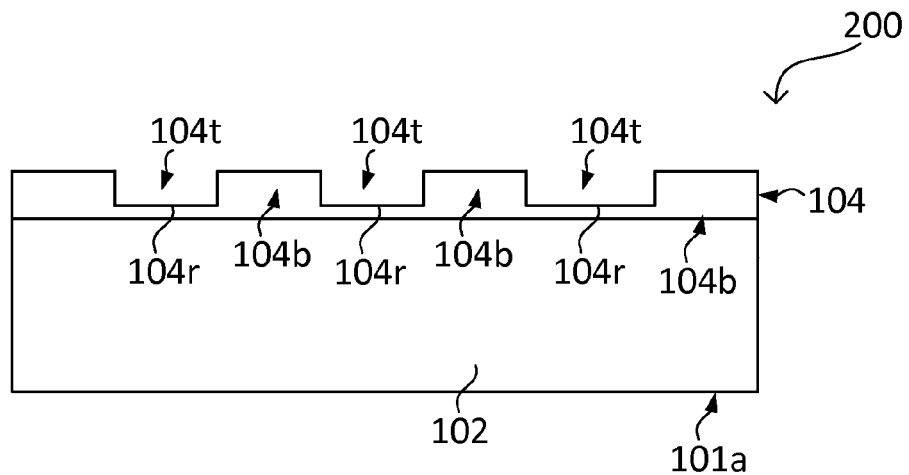
FIG. 3A to FIG. 3G respectively show a substrate at various stages during processing according to various embodiments.

According to various embodiments, the dielectric layer 104 may be patterned or structured by various methods known from semiconductor technology, e.g. by local etching (e.g. using a mask, e.g. a photoresist mask or a nitride mask), or local chemical reaction (e.g. local oxidation), or local deposition, e.g. using a mask. The dielectric layer 104 may be patterned or structured such that a plurality of recesses 104r is provided in the dielectric layer 104, as illustrated in FIG. 3A. A recess of the plurality of recesses 104r may define a test region of the plurality of test regions 104t. In other words, forming the dielectric layer may provide a recess 104r in at least one test region of the plurality of test regions 104t.

According to various embodiments, at least two test regions of the plurality of test regions 104t may be separated by a field dielectric structure 104b (e.g. a field oxide 104b) from each other. The thickness of the dielectric layer 104 in the field dielectric structure 104b may be greater than the thickness of the dielectric layer 104 in the plurality of test regions 104t. The thickness of the dielectric layer 104 in the field dielectric structure 104b may be in the range of about 100 μm to about 2000 μm. For example, the plurality of test regions 104t may be implemented in or surrounded by a thicker dielectricum (also referred as dielectric material), e.g. a field oxide 104b, a shallow trench isolation 104b, or local oxidized silicon 104b (also called locos oxide). Illustratively, the field dielectric structure 104b may provide a lateral insulation between corresponding transistors of a completely processed chip, which are processed from the plurality of test regions 104t.

Figure 3B:
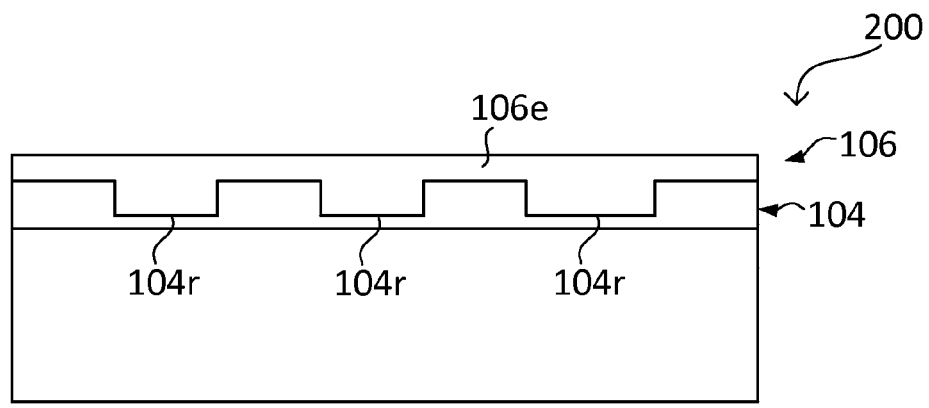

As illustrated in FIG. 3B, the electrically conductive layer 106 may contact the dielectric layer 104 in the plurality of recesses 104r. According to various embodiments, the electrically conductive layer 106 may be made from the electrically conductive material 106e, which electrically connects the plurality of recesses 104r (in parallel). Illustratively, the electrically conductive layer 106 may be in physical contact to a bottom side of a recess of the plurality of recesses 104r. In other words, the electrically conductive layer 106 may at least partially fill the plurality of recesses 104r.

Figure 3C:
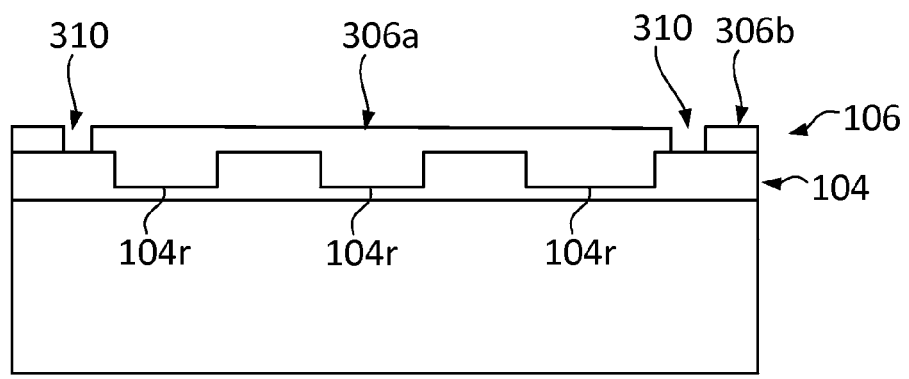

Further, a trench structure 310 (also referred as second trench structure 310) may be formed through at least the electrically conductive layer 106 to electrically separate a first region 306a of the electrically conductive layer 106 from a second region 306b of the electrically conductive layer 106, as illustrated in FIG. 3C. The first region 106a of the electrically conductive layer 106 may contact the plurality of recesses 104r. Illustratively, the first region 106a of the electrically conductive layer 106 may correspond to an active chip region 106a.

Figure 3D:
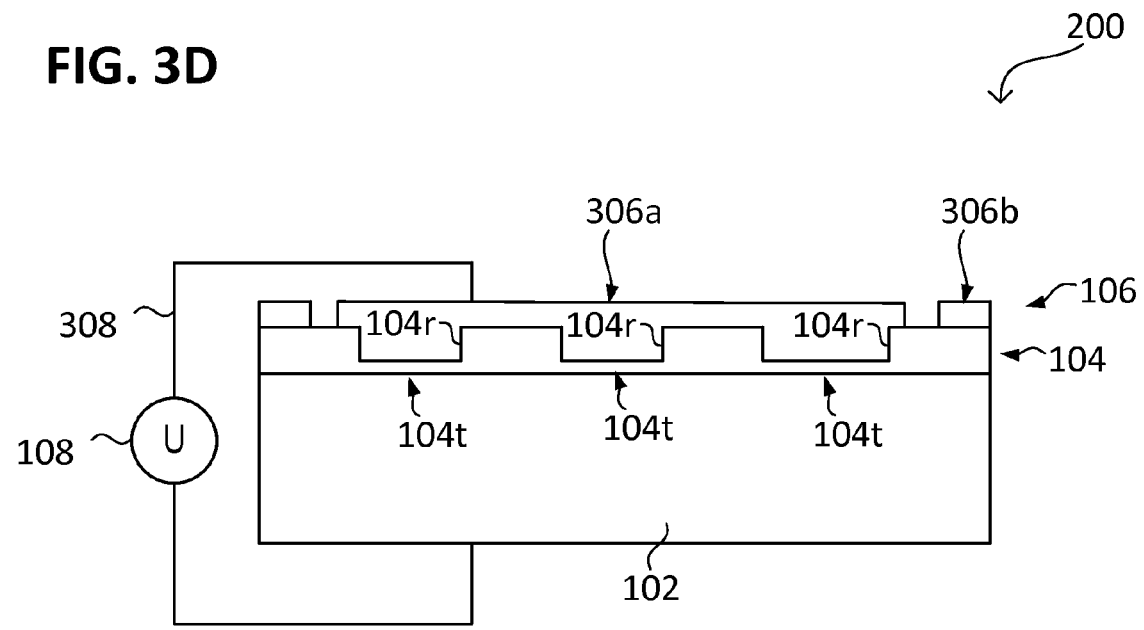

According to various embodiments, a test device 108 may be electrically coupled to the first region 306a of the electrically conductive layer 106, e.g. by an electrical wire 308, e.g. by bonding or press contacts, as illustrated in FIG. 3D. The plurality of recesses 104r may be connected in parallel and coupled to the test device 108 for electrical examining the plurality of recesses 104r (simultaneously). The test device 108 may further be electrically coupled the semiconducting material 102 of the substrate 200, e.g. by an electrical wire 308, e.g. by bonding or press contacts. The test device 108 may be electrically coupled to a chuck (also called wafer chuck) on which the substrate 200 may be mounted (and fixed) for processing.

According to various embodiments, the test device 108 may provide an alternating voltage (AC) or a direct voltage (DC) and may be configured to measure an electrical current between the first region 306a of the electrically conductive layer 106 and the semiconducting material 102 of the substrate 200, in other words a current which flows through the plurality of recesses 104r simultaneously (in a vertical direction).

Figure 3E:
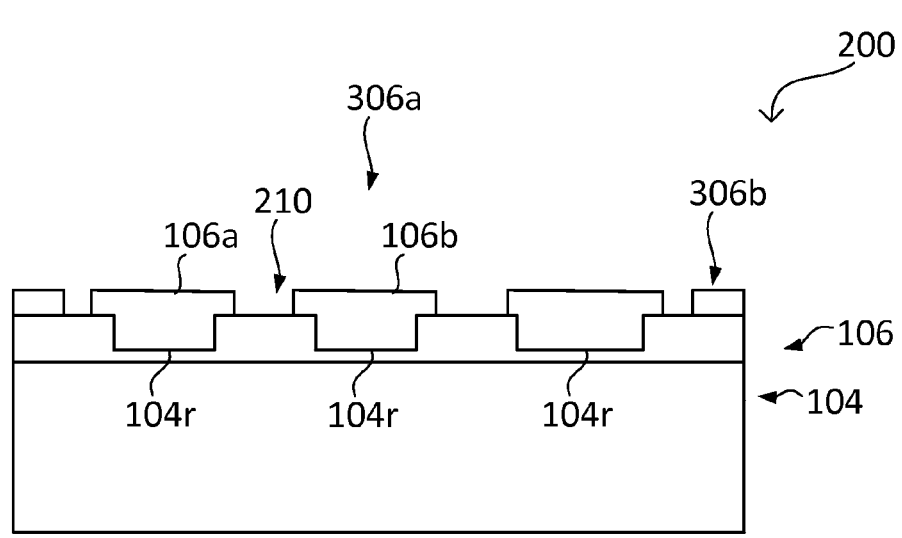

As illustrated in FIG. 3E, after electrically examining, the trench structure 210 (also referred as first trench structure 210) may be formed to separate the first portion 106a of the electrically conductive layer 106 from the second portion 106b of the electrically conductive layer 106. The first portion 106a of the electrically conductive layer 106 and the second portion 106b of the electrically conductive layer 106 may be part of the first region 306a (or a first active chip region 306a) of the electrically conductive layer 106.

In other words, forming the trench structure 210 in the first region 306a of the electrically conductive layer (after electrical examining) may remove the electrical coupling between the first portion 106a of the electrically conductive layer 106 and the second portion 106b of the electrically conductive layer 106. Therefore, a plurality of electrically separated gate terminals 106a, 106b (or capacitor terminals 106a, 106b) may be processed from the first region 306 of the electrically conductive layer 106, wherein every gate terminal of the plurality of separated gate terminals 106a, 106b electrically contacts one recess of the group of recesses 104r (or one test region 104t).

Figure 3F:
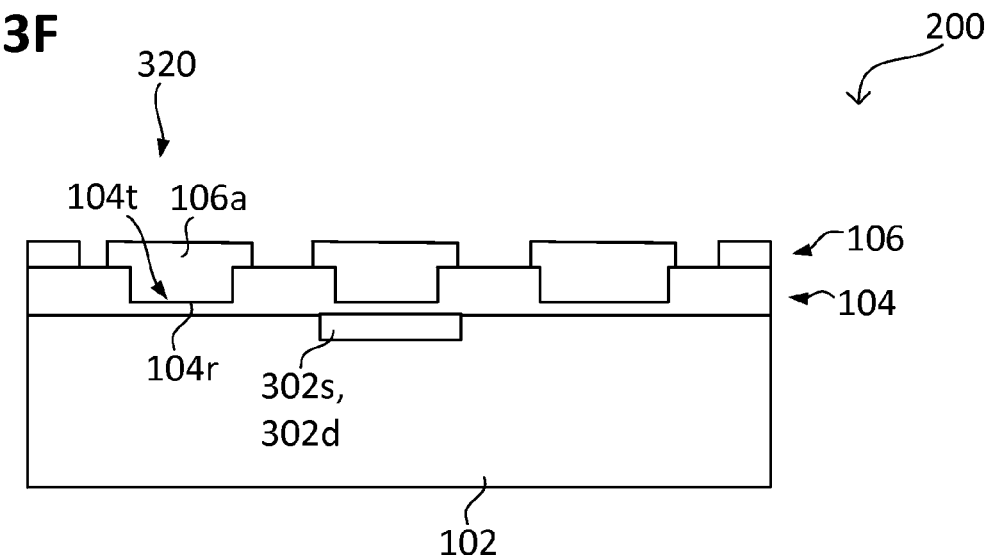

As illustrated in FIG. 3F, at least one source region 302s and/or at least one drain region 320d may be formed adjacent to one recess 104r (electrically connected to the first portion 106a of the electrically conductive layer 106) of the plurality of recesses to form a transistor structure 320 (exemplarily illustrated as cross sectional view perpendicular to a conductive channel that may form during operating the transistor structure 320). In other words, at least one source region 302s and/or at least one drain region 320d may be formed adjacent to one test region 104t (which is electrically contacted by the first portion 106a of the electrically conductive layer 106) of the plurality of test regions 104t to form a transistor structure 320. A source region 302s and/or a drain region 320d may be formed by doping (e.g. by ion implantation) the semiconducting material 102 of the substrate to form a p-type doped semiconductor region 320s or an n-type doped semiconductor region 320d. The transistor structure 320 may include the first portion 106a of the electrically conductive layer 106, which provides the gate electrode 106a, the source region 302s and/or the drain region 320d. Forming the source region 302s and/or the drain region 320d may be carried out prior electrically examining, or, alternatively, after electrically examining.

Figure 3G:
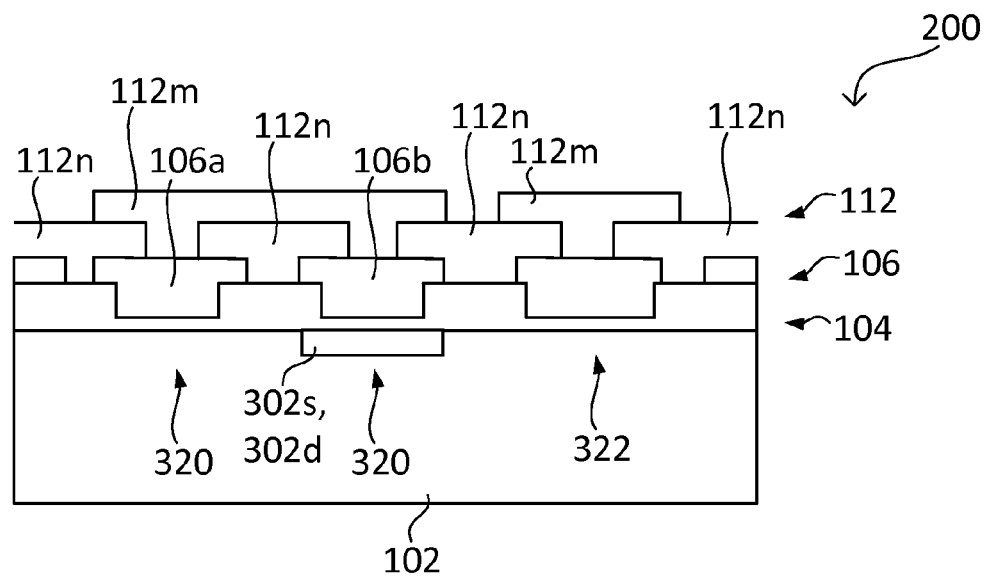

As illustrated in FIG. 3G, further transistors 320, or capacitors 322 (also referred to as electrical circuit components 320, 322) may be formed to provide a plurality of transistors 320 and/or a plurality of capacitors 322 from the first region 106 of the electrically conductive layer contacting the dielectric layer. According to various embodiments, a layer stack 112 may be formed over the electrically conductive layer 106. The layer stack 112 may include a metallization layer 112m, which contacts the conductive layer 106 in corresponding regions, e.g. in the first region 106a and/or the second region 106b. Therefore, the metallization layer 112m may be structured and/or patterned to provide a logical interconnection (or an interconnection layout) between the corresponding regions of the conductive layer 106. Further, the layer stack 112 may include a non-conducting layer 112n (e.g. an interlayer dielectric, e.g. an interlayer oxide), e.g. formed from an insulating material, disposed between the electrically conductive layer 106 and the metallization layer 112m. The non-conducting layer 112n may include contact holes (also called vias) over the corresponding regions of the conductive layer 106 which the metallization layer 112m may extend through to electrically contact the electrically conductive layer 106.

The metallization layer 112m may be formed from a metal, e.g. copper or aluminum, a metal alloy or an intermetallic compound (also referred as metal layer 112m) and may be configured to electrically interconnect at least the first portion 106a of the electrically conductive layer 106 (also referred as first gate terminal 106a) to the second portion 106b of the electrically conductive layer 106 (also referred as second gate terminal 106b). In other words, the layer stack 112 may electrically couple the electrical circuit components 320, 322 with each other to form a logical interconnection between the electrical circuit components 320, 322, which may be configured to perform computing or storage operations, switching operations (including power devices) or analog operations. Illustratively, the electrical circuit components 320, 322 that are logical interconnected may be part of or form an integrated circuit structure (or a chip). According to various embodiments, the layer stack 112 may include further metallization layers 112m and corresponding non-conducting layers 112n in between the further metallization layers 112m, forming a metallization multilayer structure (also called back end of line (BEOL)). A metallization multilayer structure may provide complex interconnection layouts, such as required for a highly complex integrated circuit structure.

Figure 4A:
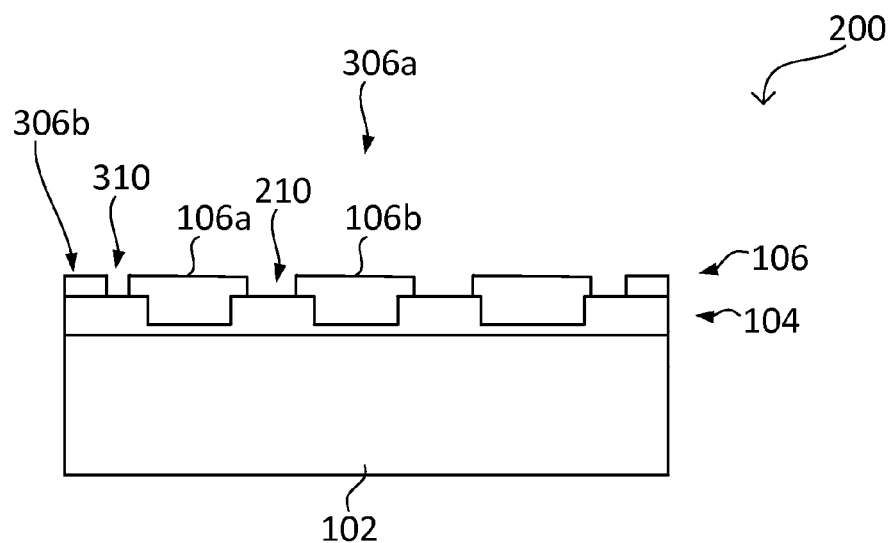
FIG. 4A to FIG. 4C respectively show a substrate at various stages during processing according to various embodiments.
Figure 4B:
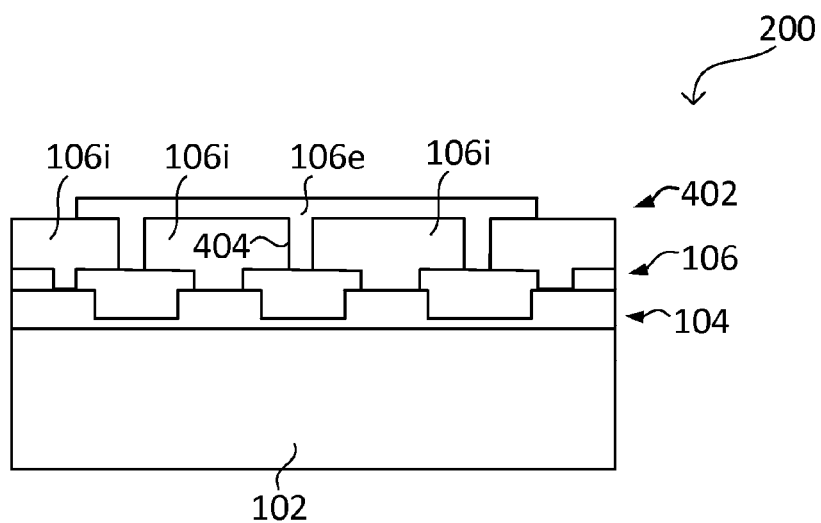
Figure 4C:
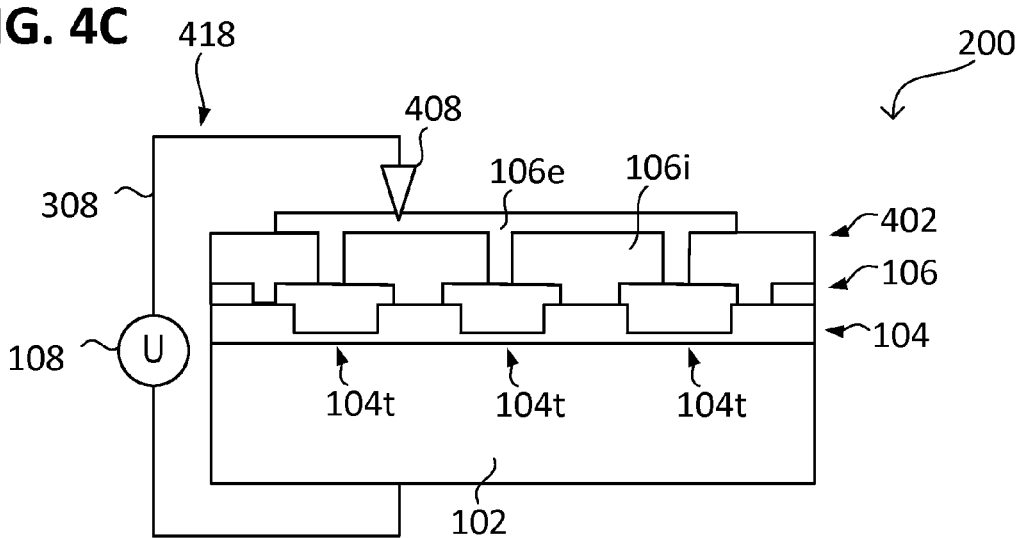

FIG. 4A to FIG. 4C respectively show a substrate 200 in a cross-sectional view (e.g. along plane 111, see FIG. 5A or FIG. 5B) at various stages during processing according to various embodiments, e.g. during method 100 is carried out.

As illustrated in FIG. 4A, after forming the dielectric layer 104 and after forming the electrically conducting layer 106, the first trench structure 210 and the second trench structure 310 may be formed, e.g. together, e.g. in one process, e.g. by sharing a mask. The first trench structure 210 may separate the first region 306a in at least the first portion 106a of the electrically conductive layer 106 and the second portion 106b of the electrically conductive layer 106. The second trench structure 310 may separate the conductive layer 106 at least into the first region 306a of the electrically conductive layer 106 and the second region 306b of the electrically conductive layer 106.

According to various embodiments, after forming the first trench structure 210 and the second trench structure 310 a bridge structure 402 may be formed over the first region 306a of the electrically conductive layer 106, as illustrated in FIG. 4B. The bridge structure 402 may electrically contact at least the first portion 106a of the electrically conductive layer 106 and the second portion 106b of the electrically conductive layer 106. The bridge structure 402 may include the electrically conducting material 106e for electrically contacting the first region 306a in the portions 106a, 106b of the electrically conductive layer 106, such that the plurality of test regions 104t may be electrically conducted with each other in parallel.

According to various embodiments, the bridge structure may be formed to connect the dielectric layer 104 in test regions 104t with substantially equally thickness. Therefore the thickness of the dielectric layer 104 may be measured in the test regions 104t before electrically connecting them, e.g.

by optical methods, e.g. by an ellipsometer. A substantially equal thickness may be understood as the test regions 104t having a thickness distribution with a mean thickness, the deviation (or range) of the thickness distribution may be less than about 30% of the mean thickness, e.g. less than about 20%, e.g. less than about 10%. In this case, the electric field generated by applying a voltage to the test regions 104t with substantially equally thickness may substantially be the same, the examination results being therefore facilitated comparably.

According to various embodiments (optionally), the bridge structure 402 may include an electrically insulating mask 106i formed from an electrically insulating material, e.g. from a resin, a resist (e.g. photoresist) or an electrically insulating polymer. The electrically insulating mask 106i may be formed over the electrically conductive layer 106 and over the dielectric layer 104, completely filling at least the first trench structure 210. In other words, the electrically insulating mask 106i may electrically insulate the dielectric layer 104 from the electrically conductive material 106e.

According to various embodiments, the electrically insulating mask 106i may include a plurality of vias 404. Each via of the plurality of vias 404 may completely (vertically) extend through the insulating material of the electrically insulating mask 106i to one portion 106a, 106b of the electrically conductive layer 106. The electrically conductive material 106e may be disposed into the plurality of vias 404 such that the portions 106a, 106b of the electrically conductive layer 106 are electrically conductively connected with each other by the electrically conductive material 106e.

Alternatively, according to various embodiments, the insulating material of the electrically insulating mask 106i may exclusively at least partially filling the first trench structure 210. According to various embodiments, alternatively, the electrically conductive material 106e may at least partially filling the first trench structure 210, in other words the bridge structure 104 may not necessary include the electrically insulating mask 106i.

As illustrated in FIG. 4C, the electrically conductive material 106e may be electrically coupled to the measurement device 108. Therefore, a contact probe 408 (also called test probe 108) may electrically contact the electrically conductive material 106e. The test probe 408 (e.g. a pin, a spike, a nail, a bolt, or needle), may be part of a contact probe array (also called testing grid), e.g. a rigid-pin fixture, a nail tester (also called bed-of-nail adapter) or an in-circuit-test adapter.

According to various embodiments, the contact probe 408 may be electrically coupled with the measurement device 108, e.g. using a contact structure 308 with electrical wires or electrical leads. The contact probe 408, the measurement device 108, and the contact structure 308 may be part of a testing system 418, e.g. an in-circuit-test system or a fixtureless in-circuit test system. The testing system 418 may be configured for examining the dielectric layer 104 in the plurality of test regions 104t in parallel, as described herein. Further, the testing system 418 may be configured for electrically contacting at least the first region 306a of the electrically conductive layer 106 and the second region 306b of the electrically conductive layer 106 in parallel or serially, for electrically examining a plurality of regions 306a, 306b of the electrically conductive layer 106 in parallel or serially.

After examining the dielectric layer 104 in the plurality of test regions 104t, the bridge structure 402 may be removed (or released), e.g. by etching (e.g. wet etching, plasma etching, or reactive etching), or stripping (also called resist stripping). Removing the bridge structure 402 may expose the electrically conductive layer 106. After removing the bridge structure 402 a layer stack 112, e.g. with a metal layer 112m, may be formed over the electrically conductive layer 106, as described herein (see e.g. FIG. 3G). By using the electrically insulating mask 106i, removing (or releasing) the electrically conductive material 106e may be facilitated, dependent of the material used to form the electrically insulating mask 106i. For example, the bridge structure 402 may be released by an organic dissolvent (e.g. acetone) if the electrically insulating mask 106i is made from a resist (also called resist stripping).

Figure 5A:
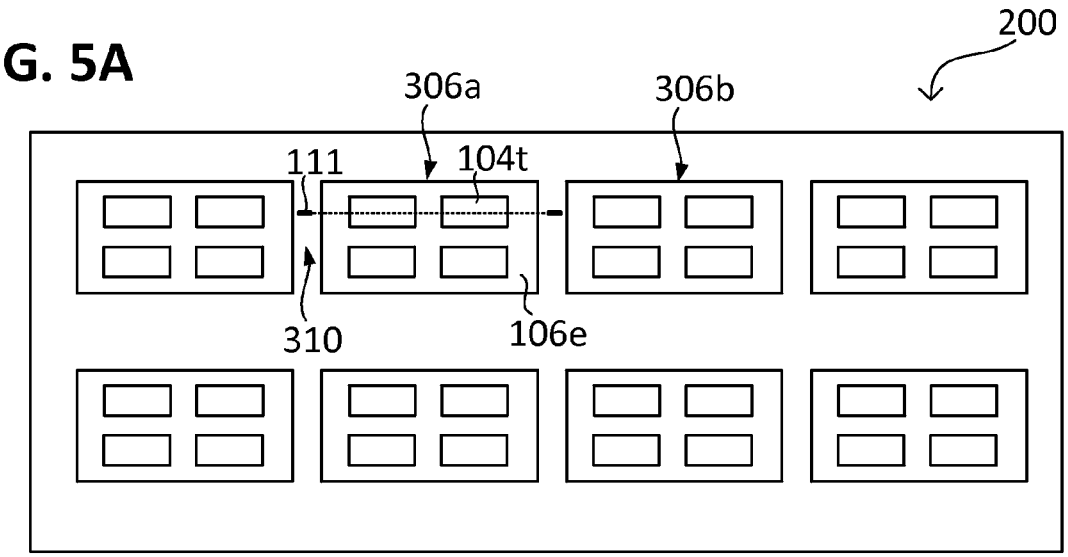
FIG. 5A to FIG. 5B respectively show a substrate at various stages during processing according to various embodiments.

FIG. 5A shows a substrate 200 at various stages during processing, according to various embodiments, in a top view (in a direction towards the first surface 101a of the substrate), e.g. during method 100 is carried out. FIG. 5A shows a substrate 200 in a stage during processing, for example, in analogy to FIG. 2B, FIG. 3B or FIG. 4B.

As described herein, the second trench structure 310 may be formed to electrically separate at least the first region 306a of the electrically conductive layer 106 from the second region 306b of the electrically conductive layer 106. For example, the second trench structure 310 may also extend into the dielectric layer 104, or the second trench structure 310 may also extend into the substrate 200. For example, the second trench structure 310 may be formed in a kerf region of the substrate 200.

According to various embodiments, a chip (also called semiconductor chip) may be singulated from the substrate 200 (e.g. a wafer) by removing material from the kerf region of the substrate 200 (also called dicing or cutting the wafer). For example, removing material from the kerf region of the substrate 200 may be processed by scribing and breaking, cleavage, blade dicing or mechanical sawing (e.g. using a dicing saw). In other words, the chip may be singulated by a dicing process (also called wafer-dicing process). After the dicing process, the chip may be electrically contacted and encapsulated, e.g. by mold materials, into a chip carrier (also called a chip housing) which may then be suitable for use in electronic devices such as computers. For example, the chip may be bonded to a chip carrier by wires, and the chip carrier may be soldered to a printed circuit board.

In other words, the first region 306a of the electrically conductive layer 106 and the second region 306b of the electrically conductive layer 106 may correspond to a first active chip region 306b for processing a first chip therefrom and a second active chip region 306b for processing a second chip therefrom. Further, the first region 306a of the electrically conductive layer 106 and the second region 306b of the electrically conductive layer 106 respectively may contact a plurality of test regions 104t which may be designated to be processed for forming the corresponding chip therefrom. Illustratively, method 100, may be applied to examine the dielectric layer 104 in an active chip area in which a chip will be fabricated.

According to various embodiments, the electrically conductive material 106e may be disposed locally (e.g. using a mask), such that the plurality of test regions 104t is connected by the electrically conductive material 106e in parallel, e.g. after forming the first trench structure 210 (without forming the second trench structure 310). In other words, the electrically conductive material 106e may be disposed (e.g. deposited) locally over the first region 306a of the electrically conductive layer 106.

According to various embodiments, several test regions 104t may be electrically examined simultaneously, e.g. about several tens, several hundreds, even up to several millions or several billions of test regions 104t may be electrically examined simultaneously. For example, substantially the complete active chip area of a minor complex integrated circuit structure as well as substantially the complete active chip area of a highly complex integrated circuit structure may be electrically examined simultaneously in corresponding test regions 104t.

Figure 5B:
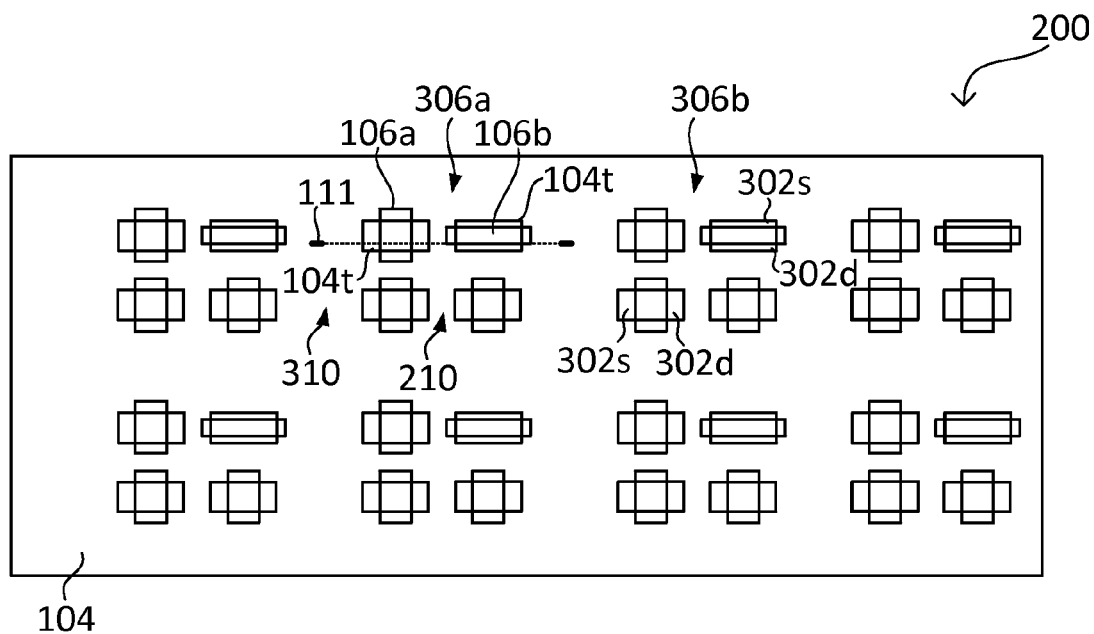

FIG. 5B shows a substrate 200 at various stages during processing according to various embodiments, in a top view (in a direction towards the first surface 101a of the substrate), e.g. during method 100 is carried out. FIG. 5B shows a substrate in a stage during processing, for example, in analogy to FIG. 2D, FIG. 3E, FIG. 3F or FIG. 4A. According to various embodiments, the electrically conducting layer 106 may partially overlap the test regions 104t.

As described herein, the first trench structure 210 may separate at least the first portion 106a of the electrically conductive layer 106 from the second portion 106b of the electrically conductive layer 106. The first trench structure 210 may also extend into the dielectric layer 104, or may also extend into substrate 200. The first trench structure 210 may be configured to receive an electrically insulating material, e.g. for electrically insulating the portions of the substrate 200 underlying the plurality of test regions 104t, e.g. for forming a shallow trench isolation (STI), e.g. for forming a field dielectric structure (e.g. in the first trench structure 210).

To evaluate as to whether a method 100 according to various embodiments had been applied during semiconductor processing, the dielectric layer 104 of a chip or a substrate 200 at various processing stages may be analyzed. For example, steps or surface irregularities in the gate dielectrics 104t (e.g. in a GOX) which had been electrically contacted, as described herein, may remain after applying the method 100 and may be detectable even after the dielectric layer 104 has been completely processed to form a chip. For example, forming a bridge structure 402, as described herein, may generate surface irregularities in the dielectric layer 104, which may be provable. For example, singulating the test regions 104t in two steps (by a first trench structure 210 and a second trench structure 310), as described herein, may generate surface irregularities in the dielectric layer 104, which may be provable. The dielectric layer 104 of a chip or a substrate 200 at various processing stages may be analyzed by a physical failure analysis including disassembling the chip or the substrate 200 layer by layer and analyzing the chip or the substrate 200 during disassembling layer by layer, e.g. by electron microscopy.

According to various embodiments, a method 100 for processing a substrate 200 may include: forming a dielectric layer 104 over the substrate 200, the dielectric layer 104 may include a plurality of test regions 104t, which may be regions in which the dielectric layer 104 is to be examined; forming an electrically conductive layer 106 over the dielectric layer 104 to contact the dielectric layer 104 in the plurality of test regions 104t; simultaneously electrically examining the dielectric layer 104 in the plurality of test regions 104t, wherein portions 106a, 106b of the electrically conductive layer 106 contacting the dielectric layer 104 in the plurality of test regions 104t may be electrically conductively connected with each other by an electrically conductive material 106e; and separating the electrically conductive layer 106 to form a plurality of portions 106a, 106b of the electrically conductive layer 106.

The method 100 may further include at least partially removing the electrically conductive material to separate the portions of the electrically conductive layer from each other. The electrically conductive material may be part of the electrically conductive layer or may be part of a bridge structure.

The method 100 may further include forming a layer stack 112 over the plurality of portions 106a, 106b of the electrically conductive layer 106 to provide a logical interconnection between the plurality of portions 106a, 106b of the electrically conductive layer.

A method 100 for processing a substrate 200 may include: forming a dielectric layer 104 over the substrate 200, the dielectric layer 104 may include a plurality of test regions 104t, which may be regions in which the dielectric layer 104 is to be examined; forming an electrically conductive layer 106 over the dielectric layer 104 to contact the dielectric layer 104 in the plurality of test regions 104t; simultaneously electrically examining the dielectric layer 104 in the plurality of test regions 104t, wherein portions 106a, 106b of the electrically conductive layer contacting the dielectric layer 104 in the plurality of test regions 104t may be electrically conductively connected with each other by an electrically conductive material 106e; and separating the separating the electrically conductive layer into portions 106a, 106b of the electrically conductive layer 106 contacting the dielectric layer 104 in the plurality of test regions 104t from each other.

According to various embodiments, the method 100 may further include forming a layer stack 112 over the portions 106a, 106b of the electrically conductive layer 106 to provide a logical interconnection between the portions 106a, 106b of the electrically conductive layer.

According to various embodiments, simultaneously electrically examining may include measuring the dielectric strength of the dielectric layer 104 in the plurality of test regions 104t. According to various embodiments, simultaneously examining may include a gate oxide integrity test (GOI). Every test region 104t of the plurality of test regions 104t may include a specific dielectric strength. In other words, the dielectric strength may be distributed over the plurality of test regions 104t, including a maximum dielectric strength and a minimum dielectric strength (also referred as weakest dielectric strength). Examining the dielectric strength of the dielectric layer 104 in the plurality of test regions 104t may reveal the minimum dielectric strength of the dielectric layer 104 in the plurality of test regions 104t.

According to various embodiments, simultaneously electrically examining may include electrically coupling a test device 108 to the portions 106a, 106b (also referred as plurality of portions 106a, 106b) of the electrically conductive layer 106 contacting the dielectric layer 104 in the plurality of test regions 104t.

According to various embodiments, simultaneously electrically examining may include providing an electric field in the dielectric layer 104 in the plurality of test regions 104t. The electric field in the dielectric layer 104 in the plurality of test regions 104t may point vertically. The electric field in the dielectric layer 104 in the plurality of test regions 104t may be provided by coupling a voltage to the dielectric layer 104 in the plurality of test regions 104t (e.g. by the electrically conducting layer 106).

According to various embodiments, simultaneously electrically examining may include measuring a thickness of the dielectric layer 104 in the plurality of test regions 104t, wherein providing the electric field may include applying a voltage to the dielectric layer 104 in the plurality of test regions 104t and measuring a characteristic variable (or a set of characteristic variables) of the dielectric layer 104 in the plurality of test regions 104t. The characteristic variable may correspond to the thickness of the dielectric layer 104 in the plurality of test regions 104t. For example, the thickness of the dielectric layer 104 in the plurality of test regions 104t may be extracted from the characteristic variable (or the set of characteristic variables), e.g. by calculation. For example, the characteristic variable may be a capacitance of the dielectric layer 104 in the plurality of test regions 104t.

Extracting the thickness of the dielectric layer 104 in the plurality of test regions 104t may provide a characterization of the dielectric layer 104 in the plurality of test regions 104t based on the thickness and changing further processing steps applied to the substrate based on the characterization. For example, changing further processing steps may include discarding a chip including the dielectric layer 104 in the plurality of test regions 104t from further assembly. Similarly, changing further processing steps may be based on the characteristic variable.

According to various embodiments, forming a dielectric layer 104 may include oxidizing a material of the substrate 200 to form a semiconductor oxide therefrom or depositing (e.g. with CVD or another deposition method) the dielectric layer 104 on the substrate 200. According to various embodiments, the method may further include at least partially removing the electrically conductive material to separate the portions of the electrically conductive layer from each other.

According to various embodiments, forming a dielectric layer 104 may include oxidizing a semiconductor material, e.g. silicon. According to various embodiments, forming the dielectric layer 104 may include forming a field dielectric structure 104b for separating the plurality of test regions 104t from each other. According to various embodiments, a thickness of the dielectric layer 104 in the plurality of test regions 104t may differ from a thickness of the dielectric layer 104 in the field dielectric structure 104b, e.g. the thickness of the dielectric layer 104 in the plurality of test regions 104t may be smaller than the thickness of the dielectric layer in the field dielectric structure 104b.

According to various embodiments, forming a dielectric layer 104 may include providing a recess 104r in at least one test region of the plurality of test regions 104t. Providing a recess 104r and/or forming a field dielectric structure 104b may include forming a window by a locos process, by a shallow trench isolation, or a field plate deposition and a structuring (or patterning) process.

According to various embodiments, forming a dielectric layer 104 may include providing at least one recess 104r in at least one test region of the plurality of test regions 104t. According to various embodiments, forming a dielectric layer 104 may include providing at least one recess 104r in every test region of the plurality of test regions 104t.

According to various embodiments, the electrically conductive layer 106 may include a semiconducting material, e.g. a polycrystalline semiconducting material, e.g. polycrystalline silicon, or doped semiconducting material, e.g. doped silicon.

According to various embodiments, separating the electrically conductive layer 106 (e.g. the portions 106a, 106b of the electrically conductive layer 106) may include forming a trench structure 210 (in other words the first trench structure 210) through at least the electrically conductive layer 106.

According to various embodiments, the electrically conductive material 106e may be part of the electrically conductive layer 106. In other words separating the portions 106a, 106b of the electrically conductive layer 106 may be carried out before electrically examining the dielectric layer 104 in the plurality of test regions 104t. Therefore, forming the first trench structure 210 may be carried out before electrically examining the dielectric layer 104 in the plurality of test regions 104t and optionally forming the second trench structure 210 may be carried out after electrically examining the dielectric layer 104 in the plurality of test regions 104t.

According to various embodiments, the portions 106a, 106b of the electrically conductive layer 106 may be separated from each other after the dielectric layer 104 in the plurality of test regions 104t has been examined.

According to various embodiments, the portions 106a, 106b of the electrically conductive layer 106 may be separated before the dielectric layer 104 in the plurality of test regions 104t has been examined.

According to various embodiments, the method 100 may further include forming a bridge structure 402 electrically connecting the portions 106a, 106b of the electrically conductive layer 106 after having been separated; the bridge structure 402 may include the electrically conductive material 106e.

According to various embodiments, forming the bridge structure 402 may include disposing an electrically insulating mask 106i between the electrically conductive material 106e and the dielectric layer 104.

According to various embodiments, forming the bridge structure 402 may include disposing an electrically insulating mask 106i between the electrically conductive material and the electrically conducting layer 106.

According to various embodiments, the electrically conductive material 106e may include a metal or a metal alloy.

According to various embodiments, the method 100 may further include removing the bridge structure 402 to expose the portions 106a, 106b of the electrically conductive layer 106 for forming a layer stack 112 over the portions 106a, 106b of the electrically conductive layer 106. Further, a layer stack 112 may be formed over the exposed the portions 106a, 106b of the electrically conductive layer 106, as described herein, e.g. by assembling a further dielectric layer (to form a non-conducting layer) with contact holes, over the portions 106a, 106b of the electrically conductive layer 106.

According to various embodiments, the method 100 may further include forming at least one source region 302s and/or at least one drain region 302d adjacent to one test region of the plurality of test regions 104t to form a transistor structure.

According to various embodiments, forming an electrically conductive layer 106 may include forming a trench structure 310 (e.g. the second trench structure 310) through at least the electrically conductive layer 106 to electrically separate at least a first region 306a of the electrically conductive layer 106 from a second region 306b of the electrically conductive layer 106, the first region 306a of the electrically conductive layer 106 may include the portions 106a, 106b of the electrically conductive layer 106 contacting the dielectric layer 104 in the plurality of test regions 104t.

According to various embodiments, the method 100 may further include forming a field dielectric structure 104b (e.g. a field oxide structure 104b) and a plurality of gate dielectric regions 104t (e.g. gate oxide regions 104t) over an integrated circuit region (also referred as active chip region) of a substrate, the plurality of gate dielectric regions 104t may be separated by the field dielectric structure 104b; electrically contacting the plurality of gate dielectric regions 104t in parallel; and simultaneously electrically examining the plurality of gate oxide regions 104t. The field dielectric structure 104b may be formed by a locos process, by a shallow trench isolation process, or a field plate deposition and a structuring (or patterning) process. By forming the field dielectric structure 104b a recess 104r in at least one test region of the plurality of test regions 104t may be provided.

A gate dielectric region 104t may be understood as a layer region, including a dielectric material. The field dielectric structure 104b may be understood as a layer structure, including a dielectric material, the field dielectric structure 104b may surround the gate dielectric regions 104*t* laterally. Further, a thickness of the gate dielectric region 104*t* may be smaller than a thickness of the field dielectric structure 104*b*. For example, the thickness of the field dielectric structure 104*b* may be in the range of about 100 μm to about 2000 μm, e.g. greater than 200 μm.

The field dielectric structure 104*b* and the plurality of gate oxide regions 104*t* may compose the dielectric layer 104. Illustratively, a gate dielectric region 104*t* may be configured to form a gate dielectric for a transistor therefrom, wherein the field dielectric structure 104*b* may provide a lateral insulation between transistors formed from the gate dielectric region 104*t*.

A method as described herein may provide process and product screening for integrated circuits (e.g. chips).

What is claimed is:

1. A method for processing a substrate, the method comprising:
    forming a dielectric layer over the substrate, the dielectric layer comprising a plurality of test regions;
    forming an electrically conductive layer over the dielectric layer to contact the dielectric layer in the plurality of test regions;
    simultaneously electrically examining the dielectric layer in the plurality of test regions, wherein portions of the electrically conductive layer contacting the dielectric layer in the plurality of test regions are electrically conductively connected with each other by an electrically conductive material; and
    separating the electrically conductive layer into portions of the electrically conductive layer contacting the dielectric layer in the plurality of test regions,
    wherein simultaneously electrically examining comprises examining the dielectric strength of the dielectric layer in the plurality of test regions.

2. The method of claim 1, further comprising:
    forming a layer stack over the portions of the electrically conductive layer to provide a logical interconnection between the portions of the electrically conductive layer.

3. The method of claim 1:
    wherein the electrically conductive layer comprises a semiconducting material.

4. The method of claim 1:
    wherein separating the portions of the electrically conductive layer comprises forming a trench structure through at least the electrically conductive layer.

5. The method of claim 1:
    wherein the electrically conductive material is part of the electrically conductive layer.

6. The method of claim 5:
    wherein the portions of the electrically conductive layer are separated after the dielectric layer in the plurality of test regions having been examined.

7. The method of claim 1, further comprising:
    forming at least one source region and at least one drain region adjacent to one test region of the plurality of test regions to form a transistor structure.

8. The method of claim 1,
    wherein forming the dielectric layer comprises forming a field dielectric structure separating the plurality of test regions from each other.

9. The method of claim 8:
    wherein a thickness of the dielectric layer in the plurality of test regions differs from a thickness of the dielectric layer in the field dielectric structure.

10. A method for processing a substrate, the method comprising:
    forming a dielectric layer over the substrate, the dielectric layer comprising a plurality of test regions;
    forming an electrically conductive layer over the dielectric layer to contact the dielectric layer in the plurality of test regions;
    simultaneously electrically examining the dielectric layer in the plurality of test regions, wherein portions of the electrically conductive layer contacting the dielectric layer in the plurality of test regions are electrically conductively connected with each other by an electrically conductive material; and
    separating the electrically conductive layer into portions of the electrically conductive layer contacting the dielectric layer in the plurality of test regions,
    wherein the portions of the electrically conductive layer are separated before the dielectric layer in the plurality of test regions having been examined.

11. The method of claim 10, further comprising:
    forming a bridge structure electrically connecting the portions of the electrically conductive layer after having been separated, the bridge structure comprising the electrically conductive material.

12. The method of claim 11:
    wherein forming the bridge structure comprises disposing an electrically insulating mask between the electrically conductive material and the dielectric layer or disposing an electrically insulating mask between the electrically conductive material and the electrically conducting layer.

13. The method of claim 11, further comprising:
    wherein the electrically conductive material comprises a metal or a metal alloy.

14. The method of claim 11, further comprising:
    removing the bridge structure to uncover the portions of the electrically conductive layer for forming a layer stack over the portions of the electrically conductive layer.

15. A method comprising:
    forming a field dielectric structure and a plurality of gate dielectric regions over an integrated circuit region of a substrate, the plurality of gate dielectric regions separated by the field dielectric structure;
    electrically contacting the plurality of gate dielectric regions in parallel; and
    simultaneously electrically examining the plurality of gate dielectric regions.

16. A method for processing a substrate, the method comprising:
    forming a dielectric layer over the substrate, the dielectric layer comprising a plurality of test regions;
    forming an electrically conductive layer over the dielectric layer to contact the dielectric layer in the plurality of test regions;
    simultaneously electrically examining the dielectric layer in the plurality of test regions, wherein portions of the electrically conductive layer contacting the dielectric layer in the plurality of test regions are electrically conductively connected with each other by an electrically conductive material; and
    separating the electrically conductive layer into portions of the electrically conductive layer contacting the dielectric layer in the plurality of test regions,
    wherein simultaneously electrically examining comprises electrically coupling a test device to the portions of the electrically conductive layer contacting the dielectric layer in the plurality of test regions.

17. A method for processing a substrate, the method comprising:

forming a dielectric layer over the substrate, the dielectric layer comprising a plurality of test regions;

forming an electrically conductive layer over the dielectric layer to contact the dielectric layer in the plurality of test regions;

simultaneously electrically examining the dielectric layer in the plurality of test regions, wherein portions of the electrically conductive layer contacting the dielectric layer in the plurality of test regions are electrically conductively connected with each other by an electrically conductive material; and separating the electrically conductive layer into portions of the electrically conductive layer contacting the dielectric layer in the plurality of test regions, wherein simultaneously electrically examining comprises providing an electric field in the dielectric layer in the plurality of test regions.

18. A method for processing a substrate, the method comprising:

forming a dielectric layer over the substrate, the dielectric layer comprising a plurality of test regions;

forming an electrically conductive layer over the dielectric layer to contact the dielectric layer in the plurality of test regions;

simultaneously electrically examining the dielectric layer in the plurality of test regions, wherein portions of the electrically conductive layer contacting the dielectric layer in the plurality of test regions are electrically conductively connected with each other by an electrically conductive material;

separating the electrically conductive layer into portions of the electrically conductive layer contacting the dielectric layer in the plurality of test regions; and at least partially removing the electrically conductive material to separate the portions of the electrically conductive layer from each other.

19. A method for processing a substrate, the method comprising:

forming a dielectric layer over the substrate, the dielectric layer comprising a plurality of test regions;

forming an electrically conductive layer over the dielectric layer to contact the dielectric layer in the plurality of test regions;

simultaneously electrically examining the dielectric layer in the plurality of test regions, wherein portions of the electrically conductive layer contacting the dielectric layer in the plurality of test regions are electrically conductively connected with each other by an electrically conductive material; and separating the electrically conductive layer into portions of the electrically conductive layer contacting the dielectric layer in the plurality of test regions, wherein forming an electrically conductive layer comprises forming a trench structure through at least the electrically conductive layer to electrically separate at least a first region of the electrically conductive layer from a second region of the electrically conductive layer, the first region of the electrically conductive layer comprising the portions of the electrically conductive layer contacting the dielectric layer in the plurality of test regions.

\* \* \* \* \*